United States Patent [19]
Noro et al.

[11] Patent Number: 5,384,432
[45] Date of Patent: Jan. 24, 1995

[54] TWO-LAYERED TAPE LEAD WIRE FOR MAGNETIC HEAD

[75] Inventors: Tetsuya Noro, Tokyo; Masahiko Itoh, Sagamihara; Nobuya Ohyama, Tokyo; Hiroshi Kanai, Tokyo; Masaharu Ishizuka, Tokyo, all of Japan

[73] Assignee: TDK Corporation, Tokyo, Japan

[21] Appl. No.: 68,141

[22] Filed: May 28, 1993

[51] Int. Cl.⁶ .................................................. H01B 7/08
[52] U.S. Cl. .......................... 174/117 FF; 174/117 F; 174/268; 360/104
[58] Field of Search ............. 174/117 F, 117 FF, 268; 360/104, 103

[56] References Cited

U.S. PATENT DOCUMENTS

| | | | |
|---|---|---|---|
| 3,107,197 | 10/1963 | Stein et al. | 174/117 FF |
| 3,633,189 | 1/1972 | Billawala | 17/117 FF X |
| 4,424,408 | 1/1984 | Elarde | 174/110 N X |
| 4,432,027 | 2/1984 | Higuchi | 360/104 |
| 4,767,892 | 8/1988 | Kobari | 361/403 X |
| 4,789,914 | 12/1988 | Ainslie et al. | 360/103 |
| 4,823,217 | 4/1989 | Kato et al. | 360/104 |
| 4,931,598 | 6/1990 | Calhoun et al. | 174/117 F |
| 5,124,864 | 6/1992 | Matsuzaki | 360/104 |
| 5,126,903 | 6/1992 | Matsuzaki | 360/104 |
| 5,185,683 | 2/1993 | Oberg et al. | 360/104 |
| 5,238,006 | 8/1993 | Markowitz | 174/117 FF |
| 5,276,573 | 1/1994 | Harada et al. | 360/103 |

FOREIGN PATENT DOCUMENTS

| | | |
|---|---|---|
| 59-31128 | 7/1984 | Japan . |
| 60-12686 | 4/1985 | Japan . |
| 60-19045 | 5/1985 | Japan . |

*Primary Examiner*—Morris H. Nimmo
*Attorney, Agent, or Firm*—Oblon, Spivak, McClelland, Maier & Neustadt

[57] ABSTRACT

A tape lead wire includes a polymer resin film and conductor films. The conductor films are directly deposited on the surface of the polymer resin film without using any bonding layer. The total thickness of the tape lead wire can be made smaller than that of a conventional lead wire. The tape lead wire has a high flexibility, can be easily bent, can extremely reduce the bending spring rigidity and is suitable for a magnetic head having a reduced size and load, which is imposed by a head supporting device on the magnetic head, and lowered flying height and peripheral speed.

3 Claims, 3 Drawing Sheets

TWO-LAYERED TAPE LEAD WIRE FOR MAGNETIC HEAD

BACKGROUND OF THE INVENTION

1. Field of the Invention

The present invention relates to a lead wire connected to an output electrode provided on a magnetic transducer element of a magnetic head, more specifically, it relates to a two-layered tape lead wire which has a high flexibility, can be easily bent, can extremely reduce the bending spring rigidity and is suitable for a magnetic head having a reduced size and load, which is imposed by a head supporting device on the magnetic head, and lowered flying height and peripheral speed.

2. Discussion of Background

Conventionally, it is to constitute a lead wire connected to an output electrode provided on a magnetic transducer element of a magnetic head by a pair of twisted wires and to connect the tip of a loop to the output electrode of the magnetic transducer element, after the loop is formed by the pair of twisted wires. As described in the U.S. Pat. No. 4,928,195, for example, it is difficult for the lead wire consisting of a pair of twisted wires to cope with a reduction in size of a magnetic head, a reduction in a load imposed by a head supporting device on the magnetic head, lowering of a peripheral speed resulting from a reduction in length of the diameter of a magnetic disk, a lowering of the flying height, which is produced by a dynamic pressure generated between the magnetic disk and the magnetic head while the magnetic recording and reading are conducted, and furthermore, an increase in the number of output electrodes caused by an increase in the number of magnetic transducer elements. As the size of the magnetic head and the load imposed by a head supporting device on the magnetic head, and its flying height and the peripherial speed are more and more reduced, the magnetic head is likely to be affected by a spring rigidity of the loop portion of the pair of twisted wires, and exerts an adverse influence on the flying height, and the flying characteristics of the magnetic head.

To reduce the influence of the spring rigidity of the loop portion of the pair of:twisted wires on the flying height of the magnetic head, an attempt to reduce the diameter of the blank wires to about 30 $\mu$m, for example, has been made, but this invites problems in that the bonding strength to the output electrodes drops and that the bonding to the output electrode becomes difficult with the reduction of the area of the output electrode due to the reduction in size of the magnetic head, because of the reduction in length of the diameter of the blank wires. Furthermore, in the case of a multiple device type of magnetic head, the bonding becomes extremely troublesome, because a large number of mutually independent blank wires exist in a small space.

Japanese Examined Patent Publication No. 59-31128, No. 60-12686 and No. 60-19045 disclose a technique using a flexible wire supporting a conductor film by a polymer resin film in place of the lead wire using lo a pair of twisted wires. FIG. 6 shows a flexible lead wire used in these prior art techniques, wherein reference numeral 1 is a polymer resin film, 2 is a bonding layer, 31 and 32 are conductor films, and 4 is a protective film. The conductor films 31 and 32 are bonded to the surface of the polymer resin film 1 by the bonding layer 2, and a laminate structure other than the protective film 4 constitutes a three-layered structure.

Nevertheless, the conventional prior art described above has the following problems.

(A) Since the structure is a three-layered structure in which the conductor films 31 and 32 are bonded to the surface of the polymer resin film 1 by the bonding layer 2, the total thickness and the bending spring rigidity are increased. The lead wire of the conventional three-layered structure has a thickness of 120 $\mu$m or more, and it is practically difficult to obtain a thickness below this value. Therefore, when a structure is employed in which the tip portion of the flexible lead wire is bent and the conductor films 31 and 32 are bonded to the output electrodes provided on the magnetic transducer element of the magnetic head, the bending spring rigidity is imposed on the magnetic head by the flexible lead wire and exerts an adverse influence on the flying height and the flying characteristics thereof. As the size of the magnetic head and the load imposed on the magnetic head are reduced, and the flying height and the periphral speed are lowered, the magnetic head is more likely to be affected by the spring rigidity of the lead wire, and thus the flying height and flying characteristics of the magnetic head are deteriorated.

(B) When the flexible lead wire is used without bending, to avoid the adverse influence caused by the bending spring rigidity, the conductor films 31 and 32 and the output electrodes of the magnetic transducer element must be connected by other connection conductors to the flexible lead wire, and this deteriorates the operation of the assembly.

(C) As a means of reducing the bending spring rigidity, it may be possible to employ a structure which has a slit, formed by cutting partially the polymer resin film 1 at the portion corresponding to the bending portion. However, since the conventional flexible lead wire has the bonding layer 2, the bonding layer 2 swells out and leads to a problem such as an inferior bonding. Therefore, a structure which forms a slit and lowers the bending spring rigidity cannot be employed.

SUMMARY OF THE INVENTION

An object of the present invention is to provide a two-layered tape lead wire for a magnetic head, which solves the problems of the prior art, has a high flexibility, can be easily bent, can extremely reduce the bending spring rigidity and is suitable for a magnetic head having a reduced size and load imposed by a head supporting device on the magnetic head, and lowered flying height and peripheral speed.

To attain the object described above, the present invention provides a lead wire to be connected to the output electrode provided on the magnetic transducer element of a magnetic head, characterized in that the lead wire comprises a conductor film and a polymer resin, and the conductor film is directly deposited on the surface of the polymer resin film without using any bonding layer.

Therefore, the total thickness of the lead wire can be made smaller than the conventional lead wire having a three-layered structure, which must essentially include the bonding layer. The total thickness of the lead wire can be easily selected to be less than 100 $\mu$m, which has not been accomplished conventionally. For this reason, the flexibility of the lead wire is increased, the lead wire becomes more easily bendable, and the bending spring rigidity is decreased. Accordingly, in combination with the magnetic head, it becomes possible to employ a structure in which the tip of the lead wire is bent and bonded to the output electrode provided on the magnetic transducer element of the magnetic head. In addition, the bending spring rigidity applied to the magnetic head is decreased. These function more effectively as the size of the magnetic head and the load imposed by a head supporting device on the magnetic head are reduced, and the flying height and the peripheral speed are lowered.

Furthermore, since the conductor film is bonded to the surface of the polymer resin film without using any bonding layer, it is posible to form slits by partially omitting the polymer resin film at the portion corresponding to the bending portion, so that the bending spring rigidity of the lead wire can be further reduced.

BRIEF DESCRIPTION OF THE DRAWINGS

A more complete appreciation of the invention and many of the attendent advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
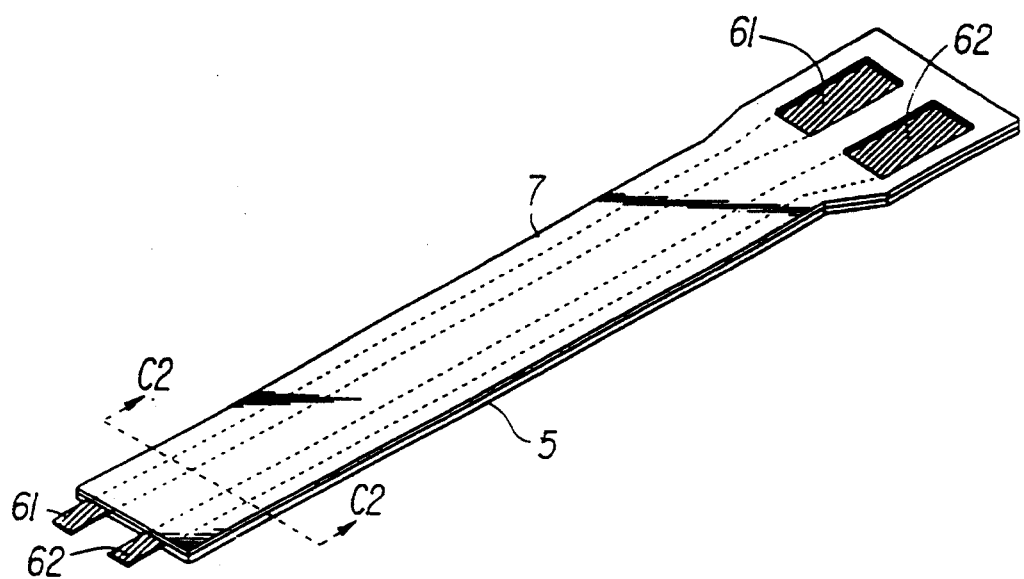
FIG. 1 is a perspective view showing a two-layered tape lead wire for a magnetic head according to the present invention.
Figure 2:
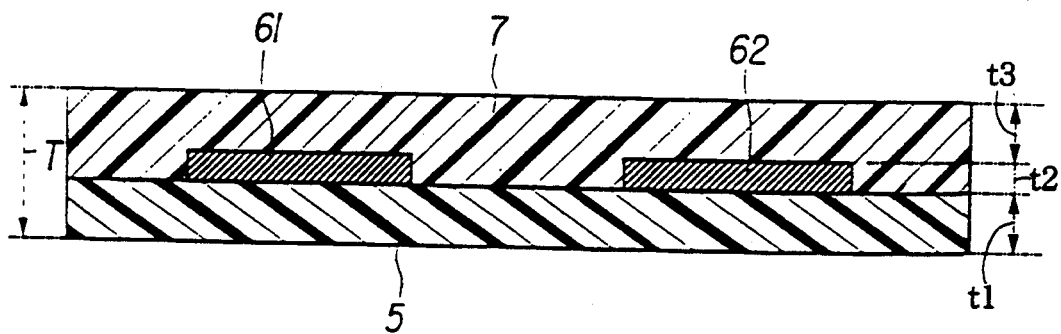
FIG. 2 is an enlarged sectional view taken along line C2—C2 of FIG. 1.

In FIGS. 1 and 2, reference numeral 5 indicates a polymer resin film, reference numerals 61 and 62 indicate conductor films and reference numeral 7 indicates a protective film. The lead wire is a TAB (Tape Automated Bonding) tape having a two-layered structure made up of the polymer resin film 5 and the conductor films 61 and 62. The polymer resin film 5 is made of a polymer resin material having an excelent electric insulating property, heat-resistance and flexibility, for example, a polyimide resin. The conductor films 61 and 62 are directly bonded to the surface of the polymer resin film 5 without using any bonding layer. They are made of a copper film and formed by employing a thin film technology such as sputtering and a high accuracy pattern formation technology such as photolithography. The conductor films 61 and 62 may have a thickness of about 5 to 50 $\mu$m. Although two conductor films 61 and 62 are shown in the drawing, the number of conductor films becomes larger when they are used for a multiple element type magnetic head. The protective film 7 is made of a polymer resin. Note, the protective film 7 can be omitted.

The total thickness T including the polymer resin film 5, the conductor films 61 and 62 and the protective film 7 is selected to be less than 100 $\mu$m. The respective thickness t1, t2 and t3 of the polymer resin film 5, the conductor films 61 and 62 and the protective film 7 (see FIG. 2) are set so as to satisfy the relationship t1=10 $\mu$m, t2=5 $\mu$m and t3=10 $\mu$m, when the total thickness is set to 25 $\mu$m, for example.

As described above, since the two-layered tape lead wire according to the invention comprises the polymer resin film 5 and the conductor films 61 and 62, and the conductor films 61 and 62 are directly bonded to the surface of the polymer resin film 5 without using any bonding layer, the laminate structure exclusive of the protective film 7 is a two-layered structure. Therefore, the total thickness T can be reduced compared to the conventional three-layered tape lead wire. The total thickness T can be easily selected to be less than 100 $\mu$m, which has not been accomplished conventionally, and accordingly, the flexibility of the lead wire is increased, the lead wire becomes more easily bendable, and the bending spring rigidity is decreased. In combination with the magnetic head, therefore, it becomes possible to employ a structure in which the conductor films 61 and 62 are bonded to the output electrode provided on the magnetic transducer element of the magnetic head by bending the tip portion of the two-layered lead wire, and the bending spring rigidity applied to the magnetic head becomes low. These function effectively as the size of the magnetic head and the load imposed by a head supporting device on the magnetic head are reduced, and the flying height and the peripheral speed become low.

Figure 3:
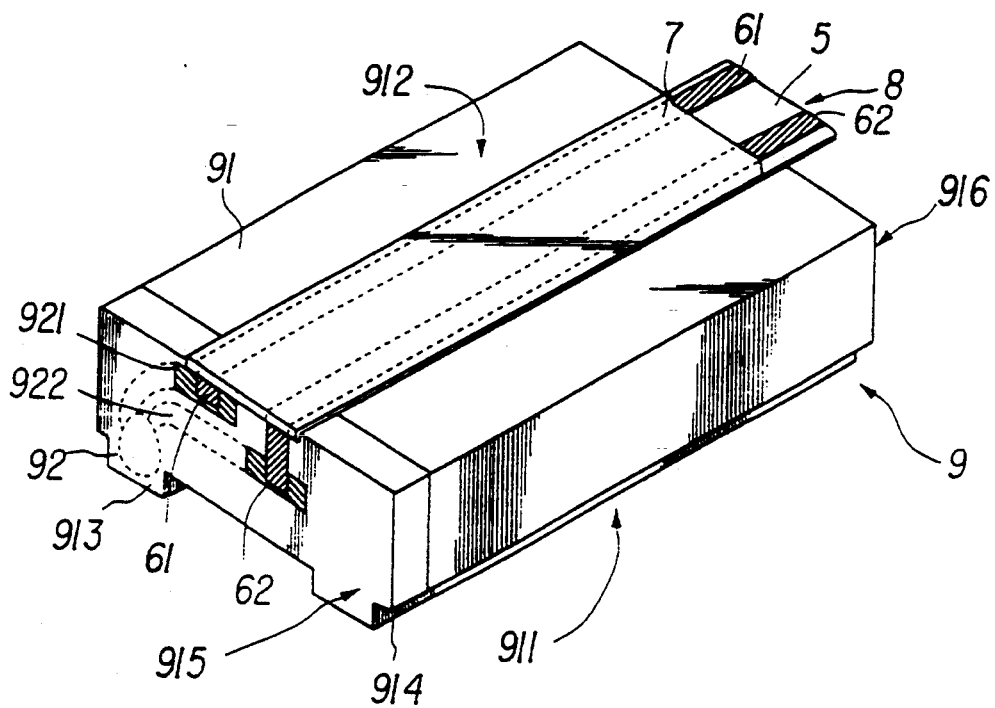
FIG. 3 is a perspective view showing an example of use where the two-layered tape lead wire for a magnetic head according to the present invention is fitted to the magnetic head.

FIG. 3 shows an example of use where the two-layered tape lead wire for the magnetic head according to the invention is fitted to the magnetic head. Reference numeral 8 indicates the two-layered tape lead wire according to the invention, reference numeral 9 the magnetic head, reference numeral 91 a slider, and reference numeral 92 a magnetic transducer element.

The side of one of the surfaces of the slider 91 is a medium opposing surface 911 and the opposite side is a supporting surface 912. The medium opposing surface 911 of the slider 91 sometimes has one to three rails or is sometimes a flat surface not having any rail portion. The highest projecting surface of the medium opposing surface 911 consitutes an air bearing surface having a high surface flatness. The slider 91 (shown in the drawing) has two rail portions 913 and 914 on the medium opposing surface 911 and each surface of the rail portions 913 and 914 is utilized as an air bearing surface.

The magnetic transducer element 92 is disposed on one of the side surfaces 915 and 916 of the slider 91 opposing each other, for example, on the side surface 915, and comprises output electrodes 921 and 922 that appear on the outside of the side surface. The side surface 915 of the slider 91 on which the magnetic transducer element 92 is disposed is generally positioned on the end portion of the medium travelling direction (air discharging direction). The magnetic transducer element 92 may be any of a thin film magnetic transducer element fabricated in accordance with the same process as IC fabrication process, a Winchester type magnetic transducer element or a composite type magnetic transducer element, and may be not only a magnetic transducer element prepared for in-line recording, but also a magnetic transducer element for vertical recording, and may be not only an inductive type magnetic tansducer element, but also a magnetic transducer element utilizing magnetoresistance effect, and may be not only a single element type, but also a multiple element type.

Furthermore, the invention can be applied not only to a flying type magnetic head, but also to a contact type magnetic head.

When the two-layered tape lead wire 8 is combined with the magnetic head 9, the tip portion of the two-layered tape lead wire 8 is bent, and the end portions of the conductor films 61 and 62 are bonded to the output electrodes 921 and 922 provided on the magnetic transducer element 92 of the magnetic head 9 by means of a soldering or an ultrasonic bonding technique. Since the conductor films 61 and 62 are directly bonded to the surface of the polymer resin film 5 without using any bonding layer, and the two-layered tape lead wire 8 has a high flexibility and low bending spring rigidity, the bending spring rigidity of the two-layered tape lead wire 8 applied to the magnetic head 9 becomes low. Thus, it is possible to obtain a stable flying characteristic of the magnetic head 9, even when the size of the magnetic head 9 and the load imposed on the magnetic head 9 are reduced, and the flying height of the magnetic head 9 and the peripheral speed of the magnetic disk are set at a low level. Although not shown in the drawings, a head supporting device is fitted to the supporting surface 912 of the slider 91. The supporting device may be disposed over or below the two-layered tape lead wire 8.

Since the two-layered tape lead wire 8 according to the present invention is a tape-like member supporting the conductor films 61 and 62 by the polymer resin film 5, it is possible to increase the bonding strength of the conductor films 61 and 62 with the output electrodes 921 and 922, by increasing a pattern of the tip portion of the conductor films 61 and 62, i.e., the pattern of the portion to be bonded to the output electrodes 921 and 922, and by increasing the bonding area. In this case, the automatic bonding method can be employed by use of a TAB tape for the two-layered tape lead wire 8. The TAB tape supplied industrially is wound on a reel and is provided with sprocket holes in a feeding direction, in the same way as a movie film. Accordingly, the TAB tape can be sequentially fed out in a predetermined direction, and the automatic coupling of the two-layered tape lead wire 8 to the magnetic head becomes possible. A solder bonding or the ultrasonic bonding technique can be used as the bonding method.

In the former case, in which the solder bonding technique is used, a solder cream, for example, is first applied to the output electrodes 921 and 922, and thereafter, these output electrodes 921 and 922 and the two-layered tape lead wire 8 are positioned. Next, the output electrodes 921 and 922 and two-layered tape wire 8 after positioning are Ted into a heating furnace kept at a temperature of 220° to 250° C., and accordingly, the solder cream is molten and the bonding is completed. As described above, a series of processes can be automated by the TAB system using the TAB tape.

In the latter case, in which the ultrasonic coupling technique is used, the two-layered tape lead wire 8 fed out from the reel is led to a known bonding device, and the two-layered tape lead wire 8 and the magnetic head 9 are positioned. According to a known bonding device, the two-layered tape lead wire 8 can be connected to the magnetic head 9 by applying an ultrasonic energy to the bonding portion without heating the magnetic head 9. In this way, a dramatic improvement in the operation can be made by the combination with the TAB system.

Furthermore, since the two-layered tape lead wire 8 has conductor films 61 and 62 which are directly bonded to the surface of the polymer resin film. 5 without using any bonding layer, it is easy to form a slit or slits at a portion corresponding to the bending portion by partially omitting the polymer resin film 5, thereby further reducing the bending spring rigidity.

Figure 4:
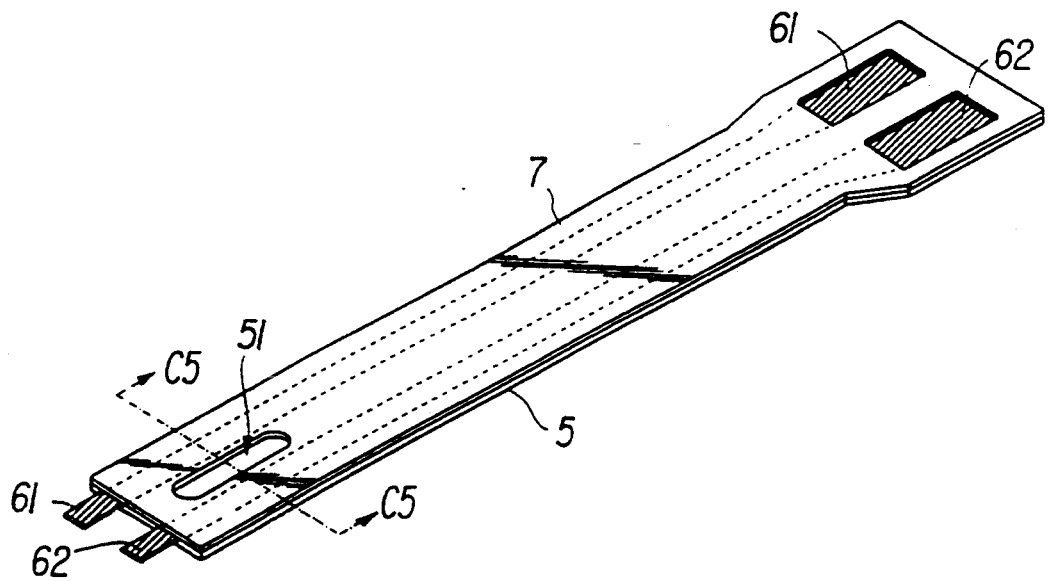
FIG. 4 is a perspective view showing a different embodiment of the two-layered tape lead wire for a magnetic head according to the present invention.
Figure 5:
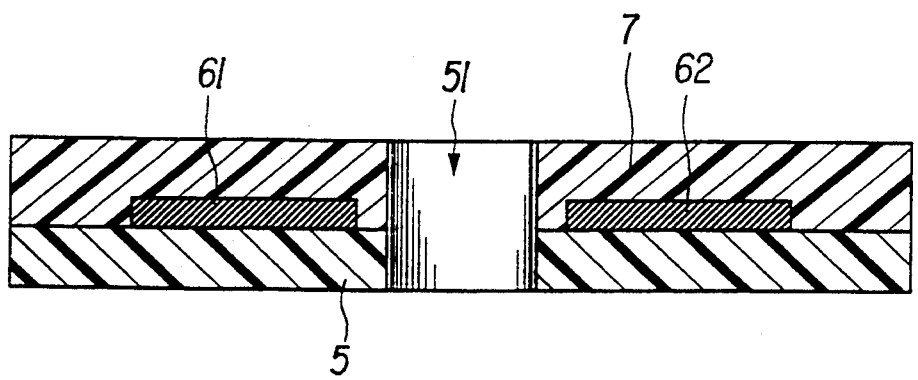
FIG. 5 is an enlarged sectional view taken along line C5—C5 of FIG. 4.
Figure 6:
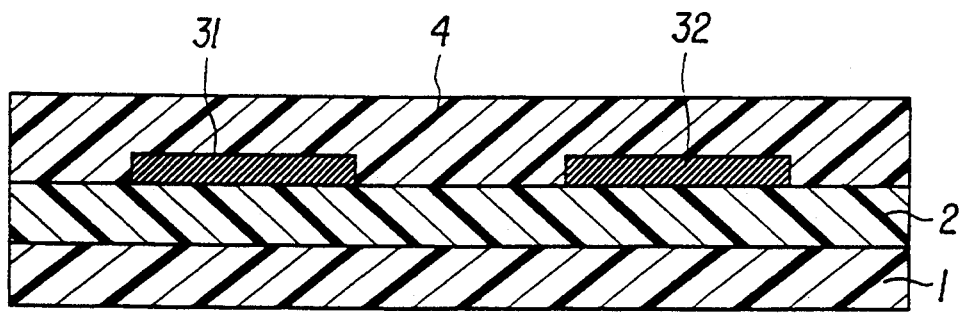
FIG. 6 is a sectional view of a conventional flexible lead wire for a magnetic head.

FIG. 4 is a perspective view showing an example of the two-layered tape lead wire having a slit and FIG. 5 is an enlarged sectional view taken along line C5—C5 of FIG. 4. Reference numeral 51 indicates a slit, which is thinly formed at the bending portion of the tip. The slit 51 can be so formed as to open at the tip end. The number of slits is arbitrary.

Although the invention has been shown and described with respect to illustrative embodiments thereof, it should be understood by those skilled in the art that the foregoing and various other changes, omissions and additions in the forms and details thereof may be made therein without departing from the spirit and the scope of the invention.

What is claimed is:

1. A magnetic head comprising: a tape lead wire having a bend of about 90° near a connection to an output electrode of a magnetic transducer element wherein said tape lead wire comprises a polymer resin film and a conductor film which is directly deposited on the surface of said polymer resin film without the use of a bonding layer and has a total thickness of 100 $\mu$m or less.

2. A two-layered tape lead wire according to claim 1, wherein said polymer resin film has a slit or slits at a portion corresponding to said beat portion.

3. A two-layered tape lead wire according to claim 1, wherein said polymer resin film is a tape-like TAB tape.

* * * * *